(12) United States Patent
Noguchi et al.

(10) Patent No.: US 11,740,419 B2
(45) Date of Patent: Aug. 29, 2023

(54) OPTICAL SUBASSEMBLY

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 580 days.

(21) Appl. No.: 17/038,076

(22) Filed: Sep. 30, 2020

(65) Prior Publication Data

US 2021/0132305 A1    May 6, 2021

(30) Foreign Application Priority Data

Nov. 1, 2019  (JP) .................................. 2019-199887
Jul. 28, 2020  (JP) .................................. 2020-127761

(51) Int. Cl.

| H05K 1/02 | (2006.01) |
| H05K 1/18 | (2006.01) |
| G02B 6/42 | (2006.01) |
| H01S 5/024 | (2006.01) |
| H04Q 11/00 | (2006.01) |

(Continued)

(52) U.S. Cl.
CPC ........... *G02B 6/428* (2013.01); *G02B 6/4246* (2013.01); *G02B 6/4263* (2013.01); *G02B 6/4271* (2013.01); *H01S 5/02212* (2013.01); *H01S 5/02345* (2021.01); *H01S 5/02415* (2013.01);

(Continued)

(58) Field of Classification Search
CPC .... G02B 6/428; G02B 6/4246; G02B 6/4263; G02B 6/4171; H01S 5/02345; H01S 5/02212; H01S 5/02415; H04Q 11/0005; H04D 2011/0041
See application file for complete search history.

(56) References Cited

U.S. PATENT DOCUMENTS 6,868,104 B2 * 3/2005 Stewart ............... H01S 5/02212
372/36
7,061,949 B1 * 6/2006 Zhou ................... H01S 5/02257
372/36

(Continued)

FOREIGN PATENT DOCUMENTS

JP          4279134 B2    6/2009

*Primary Examiner* — Hoa C Nguyen
(74) *Attorney, Agent, or Firm* — MATTINGLY & MALUR, PC

(57) ABSTRACT

Provided is an optical subassembly, which is compact, is easy to manufacture, and has satisfactory high-frequency characteristics. The optical subassembly includes: an eyelet including a first surface, a second surface and a plurality of through-holes; a plurality of lead terminals; a relay substrate including a lead connection surface and a first bonding surface and having first and second conductor patterns formed across the lead connection surface and the first bonding surface; a device mounting unit including a second bonding surface having formed thereon third and fourth conductor patterns; and an optical device configured to convert one of an optical signal and the differential electrical signals into the other. The first and second conductor patterns on the first bonding surface are connected to the third and fourth conductor patterns by bonding wires, respectively, and the first and second bonding surfaces have normal directions in the same direction.

11 Claims, 14 Drawing Sheets

(51) Int. Cl.
*H01S 5/02212* (2021.01)
*H01S 5/02345* (2021.01)
(52) U.S. Cl.
CPC . *H04Q 11/0005* (2013.01); *H04Q 2011/0041* (2013.01)

(56) References Cited

U.S. PATENT DOCUMENTS

| | | | | |
|---|---|---|---|---|
| 7,218,657 | B2* | 5/2007 | Kihara | H01S 5/02212 372/54 |
| 7,366,215 | B2* | 4/2008 | Aruga | H01S 5/02345 372/38.1 |
| 2009/0067469 | A1* | 3/2009 | Sato | H01S 5/02253 372/109 |
| 2009/0135864 | A1* | 5/2009 | Aruga | H05K 1/0243 372/29.02 |
| 2009/0269067 | A1* | 10/2009 | Kihara | H04J 14/02 398/79 |
| 2012/0045161 | A1* | 2/2012 | Okada | H01S 5/02345 385/1 |
| 2012/0057864 | A1* | 3/2012 | Lim | G02B 6/4272 398/9 |
| 2015/0116809 | A1* | 4/2015 | Uto | H01S 5/02208 359/245 |
| 2016/0204554 | A1* | 7/2016 | Yasuda | G02B 6/4416 439/620.22 |
| 2018/0175584 | A1* | 6/2018 | Nakazawa | H01S 5/02212 |
| 2018/0310397 | A1* | 10/2018 | Noguchi | H05K 1/141 |

* cited by examiner

OPTICAL SUBASSEMBLY

CROSS-REFERENCE TO RELATED APPLICATION

The present application claims priority from Japanese application JP No. JP2020-127761 filed on Jul. 28, 2020, which claims priority from Japanese Application No. JP2019-199887 filed on Nov. 1, 2019, the content of which is hereby incorporated by reference into this application.

BACKGROUND

1. Field

The present invention relates to an optical subassembly.

2. Description of the Related Art

The internet and phone networks are mostly built from optical communication networks at present. An optical module used as an interface of a router/switch or a transmission apparatus that is optical communication equipment has an important role of converting an electrical signal into an optical signal. The optical module generally takes a mode including: an optical subassembly for housing an optical device; a printed circuit board (hereinafter abbreviated as "PCB"), on which an IC for processing signals including a modulated electrical signal is mounted among others; and a flexible printed circuit (hereinafter abbreviated as "FPC") board for electrically connecting the optical subassembly and the PCB.

In recent years, the optical module is strongly required to be not only high-speed but also low-price, and the demand for an optical module that is low in cost, and is capable of transmitting/receiving a high-speed optical signal is increasing. As an example of an optical module that meets the demand described above, one using a TO-CAN-type optical subassembly has been known in which a lead terminal to be inserted into an FPC board protrudes from a metal stem contained in a can-shaped package. The metal stem is configured so as to include an eyelet having a substantially disc-like shape and a seat provided so as to protrude from the eyelet.

In these days, further, the demand for an optical module is increasing also in the field of interfaces compliant with a standard that is called the Common Public Radio Interface (CPRI), and that is for connecting between an equipment control and radio equipment of a wireless base station. CPRI is a standard for an interface that connects between a radio equipment control (REC) and radio equipment (RE) of the wireless base station. The REC is used to execute baseband signal processing and control/management in the digital domain. The RE is used to execute amplification, modulation/demodulation, filtering, and the like of a radio signal in the analog domain. When the REC and the RE are to be connected to each other by an optical signal transmissible over a long distance, the RE is usable in an outdoor installation space in the immediate vicinity of an antenna apart from the base station.

However, outdoor installation of the RE requires the interface to be operational in a harsh temperature environment. The interface may be therefore requested to be operational in a wide temperature range called the industrial temperature range (I-temp), which is ranging from −40° C. to 85° C., in addition to being demanded by the market to be low-price. From the demands described above, technical requirements are high for a TO-CAN-type optical subassembly that is operational in a wide temperature range and that is broadband.

In general, a TO-CAN-type optical subassembly is manufactured through modularization of a plurality of compact electronic devices in an eyelet having a standardized diameter. Meanwhile, in order to use an eyelet having a diameter that is different from the eyelet used in the related art, it is required to introduce a new manufacturing apparatus. Introduction of a new manufacturing apparatus leads to an increase in manufacturing cost, and hence it is desired to use an eyelet having the same diameter as the eyelet used in the related art. In a TO-CAN-type package, in a through-hole formed in a disc-shaped eyelet, a lead terminal held by glass or other dielectric materials is arranged. The lead terminal is used to transmit an electrical signal to an optical device, and hence an area in which an electronic component other than the lead terminal can be arranged is restricted.

Further, when a temperature adjusting device and other components are arranged, a substrate on which the optical device is to be mounted is electrically separated from the disc-shaped eyelet, which serves as the ground. Therefore, it is difficult to maintain satisfactory characteristics of the optical device by connecting the substrate on which the optical device is mounted to a ground potential. Therefore, extensive studies are conducted to achieve both downsizing and high-frequency characteristics.

In Japanese Patent No. 4279134, there is disclosed a technology of transmitting a satisfactory high-frequency signal to an optical device in a compact TO-CAN-type package.

In Japanese Patent No. 4279134, there is disclosed a technology in which a pair of lead terminals configured to transmit differential signals are contained in one glass through-hole, to thereby minimize an area of a coaxial unit, and maximize a mounting area inside the TO-CAN. However, it is required to provide two lines on the same plane as the area in which the optical device is mounted, and the area for mounting other components is restricted.

Further, the electronic component and the lead terminals arranged inside the TO-CAN-type package are connected to each other by wire bonding. With the wire bonding, when directions of surfaces to which wires are connected are different, the connection is not easy.

SUMMARY

The present invention has been made in view of the above-mentioned problems, and therefore has an object to provide an optical subassembly, which is compact, is easy to manufacture, and has satisfactory high-frequency characteristics.

According to one aspect of the present invention, an optical subassembly includes: an eyelet including a first surface, a second surface arranged on an opposite side from the first surface, and a plurality of through-holes penetrating from the second surface through the first surface; a plurality of lead terminals, which are to be inserted into the plurality of through-holes, and to at least a part of which differential electrical signals are to be input; a relay substrate including a lead connection surface extending in a normal direction of the first surface, and a first bonding surface adjacent to the lead connection surface, and having a first conductor pattern and a second conductor pattern formed to extend across the lead connection surface and the first bonding surface, in which the first conductor pattern and the second conductor pattern formed on the lead connection surface are to be connected to at least a part of the plurality of lead terminals with a solder or conductive adhesive, and are configured to receive inputs of the differential electrical signals; a device mounting unit including a second bonding surface having formed thereon a third conductor pattern and a fourth conductor pattern, to which the differential electrical signals are to be input; and an optical device, which is to be mounted on the device mounting unit and electrically connected to the third conductor pattern and the fourth conductor pattern, and is configured to convert one of an optical signal and the differential electrical signals into the other, wherein the first conductor pattern and the second conductor pattern on the first bonding surface are to be connected to the third conductor pattern and the fourth conductor pattern on the second bonding surface with bonding wires, respectively, and wherein the first bonding surface and the second bonding surface have normal directions in the same direction.

Further, according to another aspect of the present invention, the optical subassembly further includes a temperature adjustment device, which is arranged to be in contact with the first surface, and is configured to adjust a temperature of the optical device. Further, according to another aspect of the present invention, the optical subassembly further includes a subcarrier, which is to be mounted on the temperature adjustment device, and on which the device mounting unit is to be mounted.

Further, according to another aspect of the present invention, in the optical subassembly, the subcarrier has a center of gravity arranged to be displaced toward the relay substrate with respect to a center of gravity of the eyelet.

Further, according to another aspect of the present invention, in the optical subassembly, the bonding wires include three or more pairs of bonding wires.

Further, according to another aspect of the present invention, in the optical subassembly, the device mounting unit further includes, as a surface adjacent to the second bonding surface, a device mounting surface, on which the optical device is to be mounted, and the third conductor pattern and the fourth conductor pattern are arranged to extend across the device mounting surface and the second bonding surface.

Further, according to another aspect of the present invention, in the optical subassembly, the plurality of lead terminals include a pair of lead terminals, to which corresponding signals are to be input, and the pair of lead terminals are fixed to a single through-hole penetrating through the eyelet with a dielectric material.

Further, according to another aspect of the present invention, in the optical subassembly, the relay substrate further includes, as a surface adjacent to the first bonding surface, a first ground pattern surface having formed thereon a first ground pattern connected to a ground, the subcarrier includes, as a surface parallel to the first ground pattern surface, a second ground pattern surface having formed thereon a second ground pattern connected to the ground, and the first ground pattern is connected to the second ground pattern by bonding wires.

Further, according to another aspect of the present invention, in the optical subassembly, the first ground pattern is arranged to extend across the first bonding surface, and the first ground pattern arranged on the first bonding surface is arranged on both sides of the first conductor pattern and the second conductor pattern.

Further, according to another aspect of the present invention, in the optical subassembly, the device mounting unit is a metal block.

Further, according to another aspect of the present invention, in the optical subassembly, the device mounting unit includes a third ground pattern, which is connected to the ground, and extends across at least two surfaces that are adjacent to each other.

DETAILED DESCRIPTION

A first embodiment of the present disclosure is described below with reference to the drawings.

Figure 1:
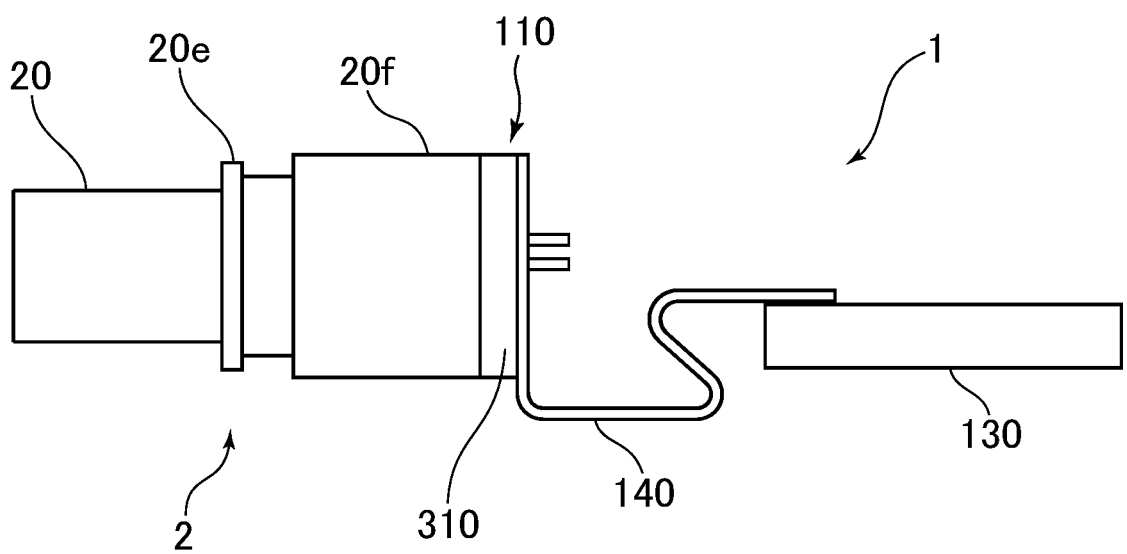
FIG. 1 is an illustration of an outline of an optical module in a first embodiment of the present invention.

FIG. 1 is an illustration of an outline of an optical module for optical communication use in the first embodiment. A modulated electrical signal and a control signal, among others, are transmitted to an optical subassembly 100 from a drive IC (not shown) mounted on a PCB 130, via an FPC 140 connected to the PCB 130 with a solder, a conductive adhesive, or the like. The FPC 140 is a flexible circuit board. The optical subassembly 100 houses an optical device 350 (see FIG. 3), and includes an interface that transmits/receives outgoing light or incident light. The optical subassembly 100 includes an eyelet 310 (see FIG. 3) and an optical receptacle 2. Although not shown, the optical subassembly 100, the PCB 130, and the FPC 140 are built in a casing made of metal or other materials to form the optical module 1.

Figure 2:
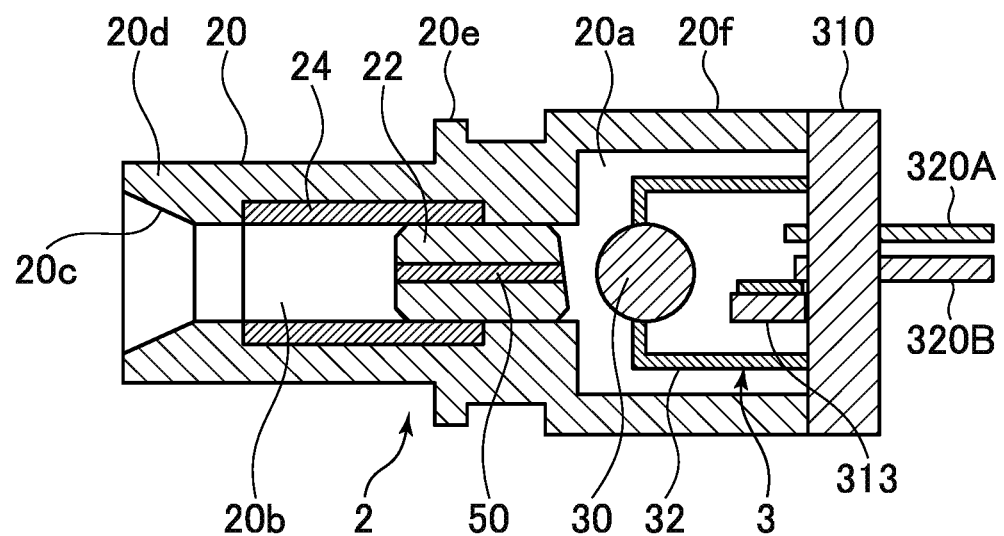
FIG. 2 is a schematic view for illustrating a sectional structure of apart of the optical module in the first embodiment.

FIG. 2 is a schematic view for illustrating a sectional structure of a part of the optical module 1 in the first embodiment. As illustrated in FIG. 2, the optical module 1 according to the first embodiment includes the optical receptacle 2 and an optical package 3. The optical receptacle 2 includes an optical receptacle main body 20, a stub 22, and a sleeve 24.

The receptacle main body 20 in the first embodiment is configured so as to include an integrally formed resin member, and includes an optical package housing 20f having a columnar outer shape and an optical fiber insertion portion 20d, which has a substantially columnar shape, and has an outer diameter smaller than an outer diameter of the optical package housing 20f. One end surface of the optical package housing 20f and one end surface of the optical fiber insertion portion 20d are joined to each other.

A circular recess portion 20a is formed in the optical package housing 20f coaxially with the outer shape of the optical package housing 20f, which gives the optical package housing 20f a cylindrical shape.

An insertion-hole 20b, which extends from a leading end surface of the optical fiber insertion portion 20d coaxially with the outer shape of the optical fiber insertion portion 20d and reaches a bottom surface of the recess portion 20a formed in the optical package housing 20f is formed in the optical receptacle main body 20. In short, the recess portion 20a and the insertion-hole 20b penetrating the optical receptacle main body 20 from the recess portion 20a to the outside are formed in the optical receptacle main body 20.

A tapered portion 20c is formed on an inner wall surface of the insertion-hole 20b at the leading end, and has a tapered shape that increases outward in diameter. This facilitates the insertion of a connector including an outer optical fiber into the insertion-hole 20b.

A flange 20e is formed along the outer circumference of the optical fiber insertion portion 20d.

The stub 22 is formed by containing zirconia or other materials. The stub 22 has a substantially columnar shape with a substantially same diameter as the insertion-hole 20b formed in the optical fiber insertion portion 20d of the optical receptacle main body 20, and holds the optical fiber 50 coaxially with the stub 22. The stub 22 is inserted and fixed into the optical fiber insertion portion 20d of the optical receptacle main body 20 by press fitting or other methods. A right end surface of the stub 22 is obliquely polished. Thus, interference between light input to the optical fiber 50 and reflected light therefrom is prevented in this manner.

A left side surface of the stub 22 of the optical receptacle 2 is abut against the connector (not shown) including the outer optical fiber, which is inserted into the insertion-hole 20b from the outside, to thereby couple the outer optical fiber that is included in the connector and the optical fiber 50 that is held by the stub 22.

The sleeve 24 is configured so as to include a slit sleeve made of zirconia or other materials. The sleeve 24 has a cylindrical shape with a substantially same inner diameter as the insertion-hole 20b, and is embedded into a groove formed in an inner wall surface of the optical receptacle main body 20. With the sleeve 24, the position inside the insertion-hole 20b of the connector including the outer optical fiber inserted into the optical fiber insertion portion 20d can be adjusted.

The optical package 3 includes a spherical lens 30. The optical package 3 also includes a lens support portion 32, which is a metal member having a cylindrical shape with a bottom having an opening formed in its bottom surface and has a substantially same diameter as the lens 30. The opening of the lens support portion 32 is formed coaxially with the shape of the bottom surface of the lens support portion 32. The lens 30 is fit into the opening of the lens support portion 32. That is, the lens support portion 32 supports the lens 30.

The optical package 3 also includes a stem that includes the eyelet 310 and seat 313 described above. The stem is formed of metal, for example, and is electrically connected to a ground conductor formed on the FPC 140 to be electrically grounded.

The optical module 1 is assembled through bonding and fixing of joining surfaces of the optical receptacle main body 20 and a first surface 311 of the eyelet 310. The optical receptacle main body 20 and the eyelet 310 form the casing. The lens support portion 32 welded to the eyelet 310 and the lens 30 fit into the lens support portion 32 are formed so as to be contained inside the recess portion 20a of the optical receptacle 2. Specifically, the lens 30 and the lens support portion 32 are housed in the recess portion 20a of the optical receptacle main body 20. The method of bonding the optical receptacle 2 and the optical package 3 to each other is not limited to the one given here.

Examples of the optical subassembly include an optical transmission subassembly (transmitter optical subassembly: TOSA), which includes a laser diode, or a similar light emitting device therein, and converts an electrical signal into an optical signal to transmit the optical signal, an optical reception subassembly (receiver optical subassembly: ROSA), which has a light receiving device, typically, a photo diode, therein, and converts a received optical signal into an electrical signal, and a bidirectional optical subassembly (BOSA), which encompasses both functions of the optical transmission module and the optical reception module. The present invention is applicable to any of the optical subassemblies given above, and the first embodiment is described by taking the optical transmission subassembly as an example.

Figure 3:
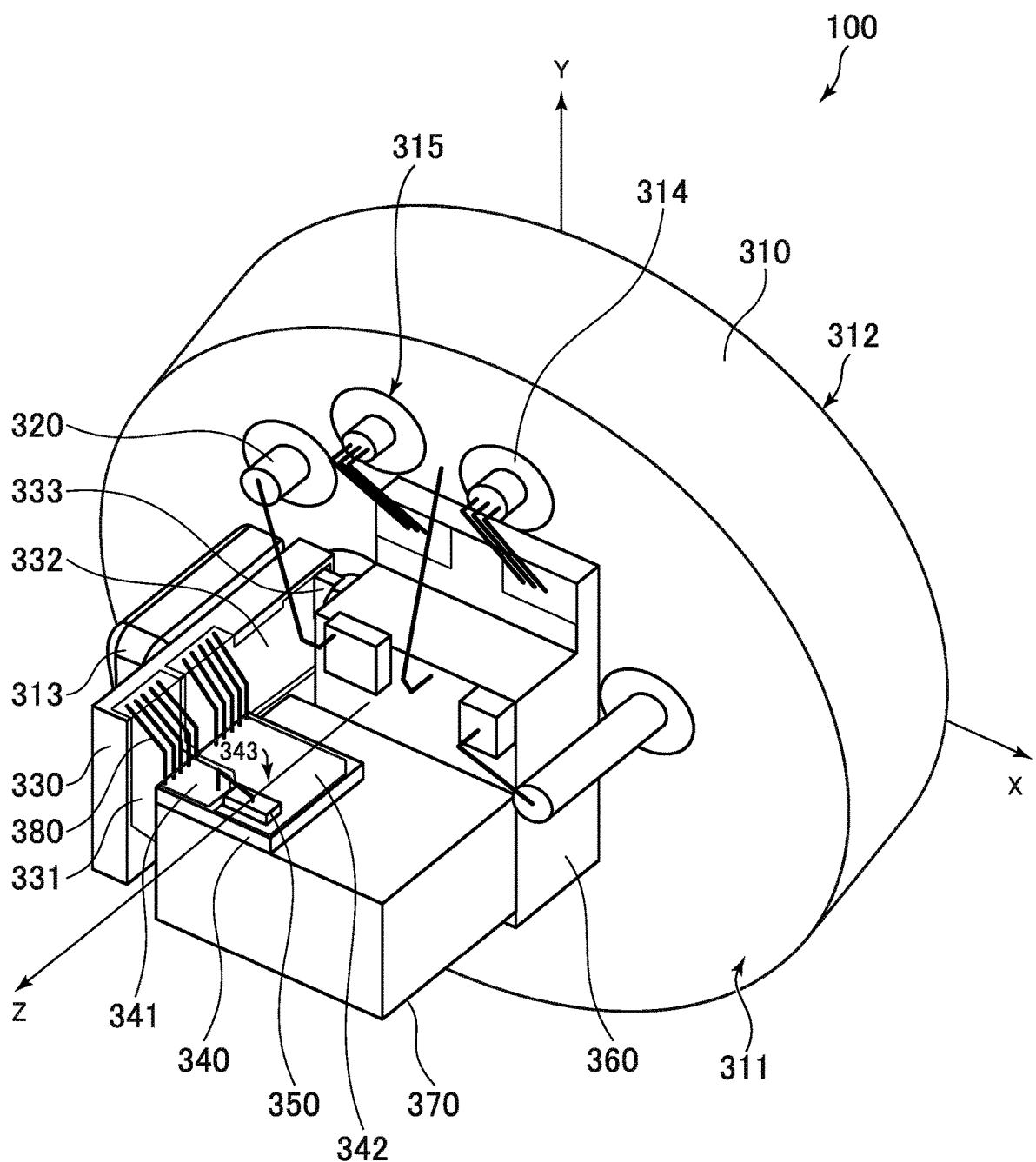
FIG. 3 is a schematic perspective view for illustrating an optical subassembly according to the first embodiment.
Figure 4:
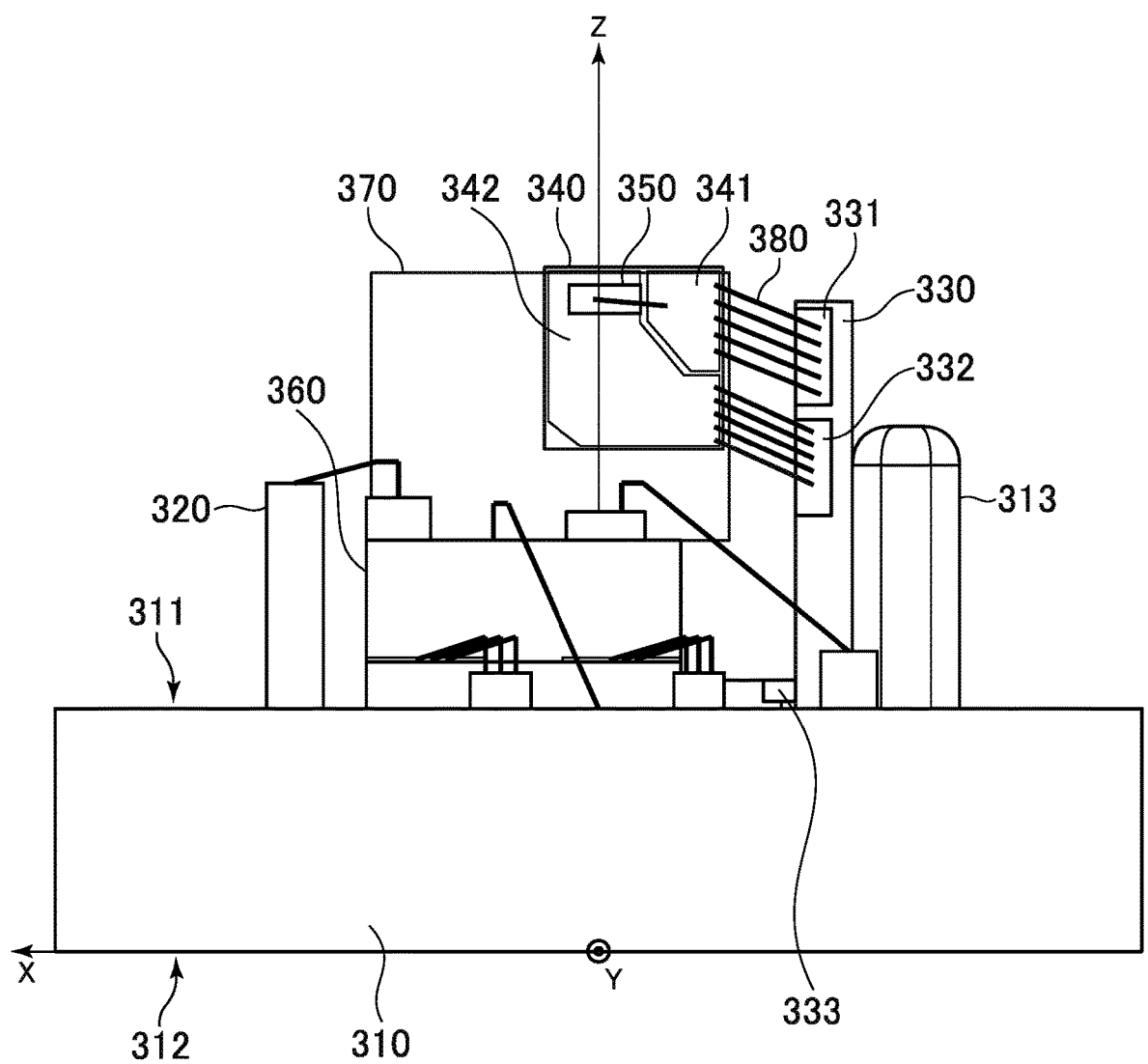
FIG. 4 is a schematic plan view of the optical subassembly according to the first embodiment when viewed from a Y direction.

FIG. 3 is a schematic perspective view for illustrating the optical subassembly 100 included in the optical module 1 in the first embodiment of the present disclosure. FIG. 4 is a view of the optical subassembly 100 included in the optical module 1 in the first embodiment of the present disclosure when viewed from a Y-axis direction.

The optical subassembly 100 includes, for example, the eyelet 310, the seat 313, lead terminals 320, a relay substrate 330, a device mounting unit 340, the optical device 350, a temperature adjustment device 360, a subcarrier 370, and bonding wires 380.

The eyelet 310 includes the first surface 311, a second surface 312 arranged on an opposite side from the first surface 311, and a plurality of through-holes 315 penetrating from the second surface 312 through the first surface 311. Specifically, for example, the eyelet 310 has a disc shape having a diameter of, for example, 5.6 mm, and is formed of a conductive material, such as metal. The eyelet 310 includes the first surface 311 on a side toward a Z-axis direction of the disc shape, and the second surface 312 on the opposite side from the first surface 311. Further, the eyelet 310 has the plurality of through-holes 315 penetrating from the first surface 311 through the second surface 312.

The lead terminals 320 are inserted into the plurality of through-holes 315, to at least a part of which differential electrical signals are to be input. Specifically, for example, the lead terminals 320 include a first lead terminal 320A to a sixth lead terminal 320F (see FIG. 5), and the lead terminals 320 are inserted into the respective through-holes 315 formed in the eyelet 310. In a gap of each of the through-holes 315 in which the respective lead terminals 320 are arranged, a dielectric material 314, such as glass, is filled. The dielectric material 314, such as glass, is configured to hold the lead terminals 320 in the respective through-holes 315. The eyelet 310, the dielectric material 314, and the lead terminals 320 form a coaxial line. In the first embodiment illustrated in FIG. 3, the differential electrical signals are input to the first lead terminal 320A and the second lead terminal 320B. To the third lead terminal 320C and the fourth lead terminal 320D, control signals for controlling the temperature adjustment device 360 are input. To the fifth lead terminal 320E and the sixth lead terminal 320F, an output monitor and a temperature monitor are connected.

The seat 313 is arranged on the first surface 311 side of the eyelet 310. In the first embodiment, the seat 313 is made of metal, and protrudes from the first surface 311 of the eyelet 310 toward the Z-axis direction in proximity to the first lead terminal 320A and the second lead terminal 320B (see FIG. 7). In the first embodiment illustrated in FIG. 3, the eyelet 310 and the seat 313 are formed integrally. The eyelet 310 and the seat 313 have the same electric potential, and form the stem. The stem in the first embodiment is molded by pressing, and is made of, for example, a rolled steel having a heat conductivity of 50 to 70 [W/m·K].

Figure 5:
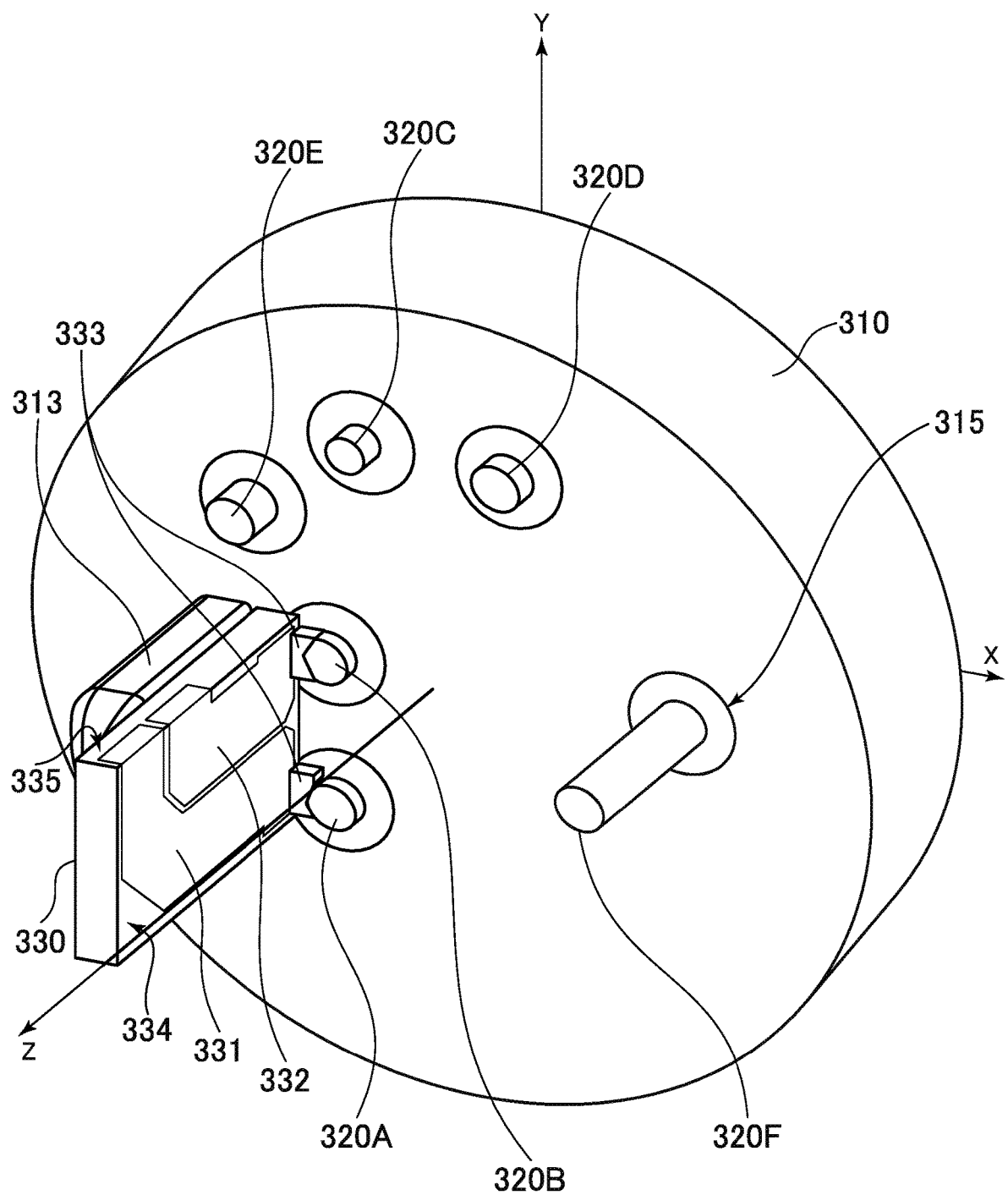
FIG. 5 is a schematic perspective view for illustrating a state in which a relay substrate is connected to a seat with a solder or conductive adhesive in the first embodiment.
Figure 6:
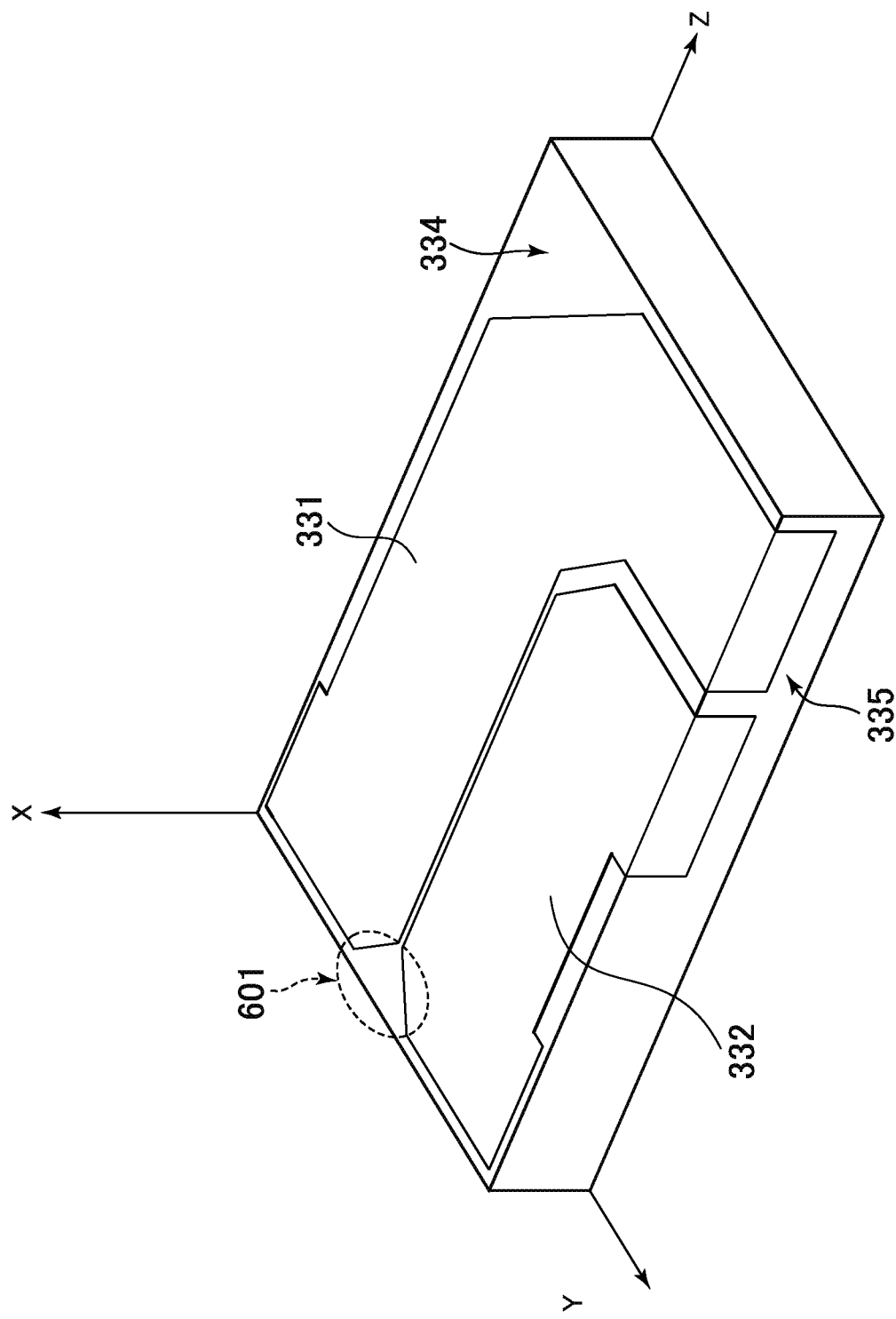
FIG. 6 is a schematic perspective view for illustrating the relay substrate in the first embodiment.
Figure 7:
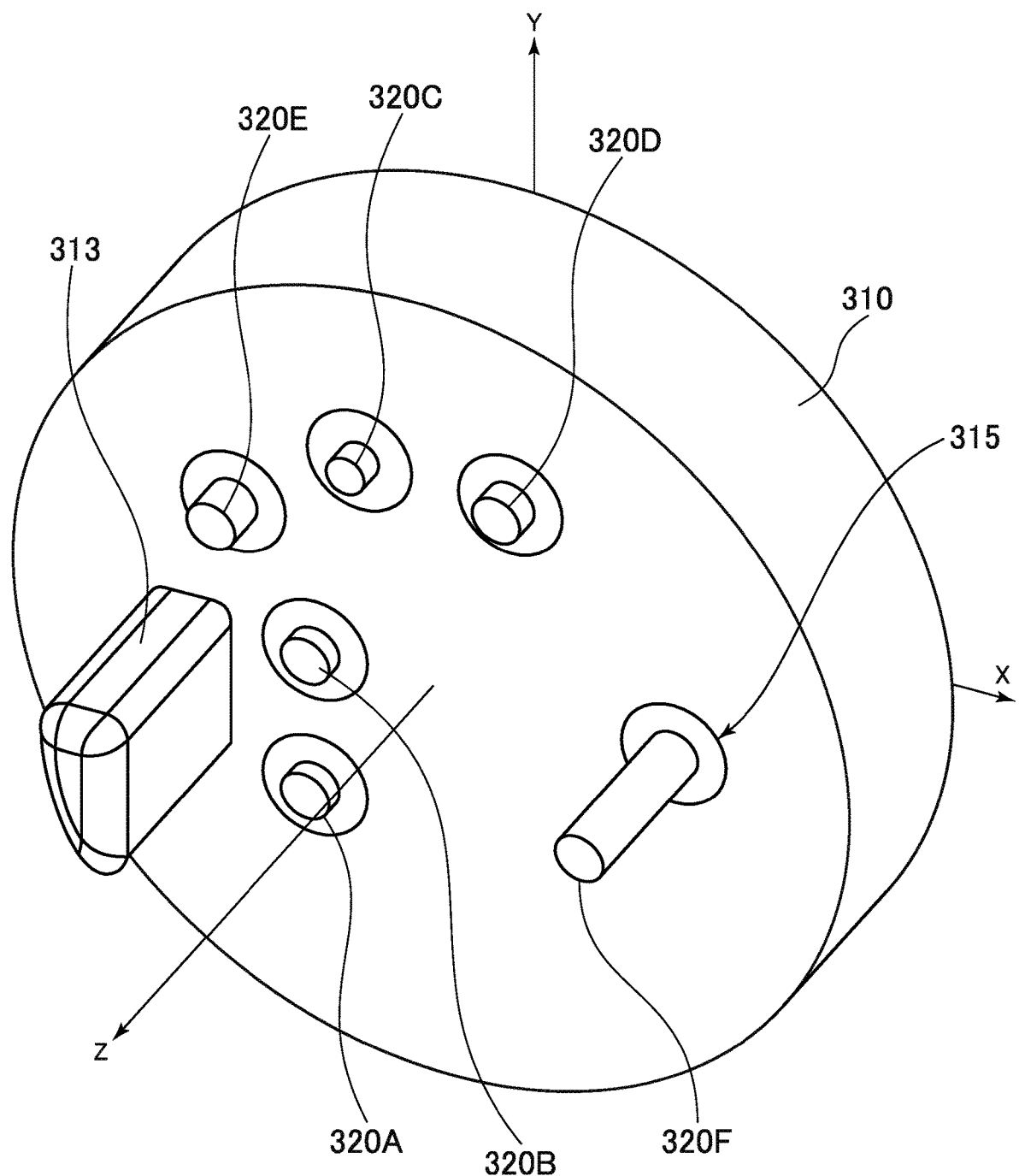
FIG. 7 is a schematic perspective view for illustrating a stem in the first embodiment.

The relay substrate 330 is arranged on an X-axis direction side of the seat 313. Specifically, description is given with reference to FIG. 5 to FIG. 7, for example. FIG. 5 is a view for illustrating a state in which the relay substrate 330 is mounted on the seat 313, and is a view omitting components other than the eyelet 310, the seat 313, the lead terminals 320, and the relay substrate 330. FIG. 6 is a view obtained by enlarging the relay substrate 330. FIG. 7 is a schematic perspective view for illustrating the stem. As illustrated in FIG. 3 and FIG. 6, the relay substrate 330 is arranged on the X-axis direction side of the seat 313.

The relay substrate 330 includes a lead connection surface 334 extending in a normal direction of the first surface 311, and a first bonding surface 335 adjacent to the lead connection surface 334. Specifically, in the first embodiment illustrated in FIG. 3 to FIG. 6, the relay substrate 330 includes the lead connection surface 334 as a surface facing the X-axis direction, and the first bonding surface 335 as a surface facing a Y direction.

Further, the relay substrate 330 has formed thereon a first conductor pattern 331 and a second conductor pattern 332 extending across the lead connection surface 334 and the first bonding surface 335. Specifically, in the first embodiment illustrated in FIG. 3 to FIG. 6, on the relay substrate 330, the first conductor pattern 331 formed on the lead connection surface 334 and the first conductor pattern 331 formed on the first bonding surface 335 are formed seamlessly so as to have the same voltage. On the relay substrate 330, the second conductor pattern 332 formed on the lead connection surface 334 and the second conductor pattern 332 formed on the first bonding surface 335 are formed seamlessly so as to have the same voltage. The first conductor pattern 331 and the second conductor pattern 332 are formed as waveguides configured to propagate the differential electrical signals. In particular, it is desired that the first conductor pattern 331 and the second conductor pattern 332 form tapers 601 at a coupling portion of the differential electrical signals. Through the formation of the tapers 601, an impedance of the differential electrical signals can be prevented from changing abruptly at the coupling portion. As a result, high-frequency characteristics can be improved.

Further, the first conductor pattern 331 and the second conductor pattern 332 formed on the lead connection surface 334 are connected to the lead terminals 320 with a solder or conductive adhesive 333, and are configured to receive inputs of the differential electrical signals. In the first embodiment illustrated in FIG. 3 to FIG. 6, the first conductor pattern 331 is connected to the first lead terminal 320A with the solder or conductive adhesive 333, and the second conductor pattern 332 is connected to the second lead terminal 320B with the solder or conductive adhesive 333.

As described above, the relay substrate 330 is arranged so that a direction the lead connection surface 334 having the larger area of the surfaces of the relay substrate 330 faces is substantially perpendicular to a direction a surface of a third conductor pattern 341 and a fourth conductor pattern 342 faces. With this configuration, the eyelet 310 can have a large number of components arranged thereon, and can be manufactured easily.

The device mounting unit 340 includes a second bonding surface 343 having formed thereon the third conductor pattern 341 and the fourth conductor pattern 342, to which the differential electrical signals are input. Specifically, the device mounting unit 340 includes the second bonding surface 343 as a surface facing the Y direction, for example. Further, the device mounting unit 340 has the third conductor pattern 341 and the fourth conductor pattern 342 formed on the second bonding surface 343. The first conductor pattern 331 and the second conductor pattern 332 on the first bonding surface 335 are connected to the third conductor pattern 341 and the fourth conductor pattern 342 on the second bonding surface 343 with the bonding wires 380. In the first embodiment illustrated in FIG. 3, the third conductor pattern 341 is electrically connected to the first conductor pattern 331 formed on the relay substrate 330 by wire bonding. Similarly, the fourth conductor pattern 342 is electrically connected to the second conductor pattern 332 formed on the relay substrate 330 by wire bonding.

As described above, to the first conductor pattern 331 and the second conductor pattern 332, the differential electrical signals connected to the first lead terminal 320A and the second lead terminal 320B are input. Therefore, to the third conductor pattern 341 and the fourth conductor pattern 342, the differential electrical signals are input through the bonding wires 380.

The optical device 350 is mounted on the device mounting unit 340 and electrically connected to the third conductor pattern 341 and the fourth conductor pattern 342, and is configured to convert one of an optical signal and the differential electrical signals into the other. Specifically, the optical device 350 is a laser diode, for example, and is mounted on a surface facing the Y direction of the device mounting unit 340. The optical device 350 is configured to receive inputs of the differential electrical signals from the third conductor pattern 341 and the fourth conductor pattern 342, and convert the differential electrical signals into the optical signal. Further, when the optical device 350 serves as a light receiving device, the optical device 350 is configured to receive an input of an optical signal, and convert the optical signal into differential electrical signals. The differential electrical signals obtained as a result of the conversion are propagated to the first lead terminal 320A and the second lead terminal 320B via the third conductor pattern 341 and the fourth conductor pattern 342, the bonding wires 380, and the first conductor pattern 331 and the second conductor pattern 332. In the first embodiment illustrated in FIG. 3, the device mounting unit 340 is a substrate.

During the wire bonding, when surfaces to which both ends of the bonding wires 380 are to be connected face different directions, it is required to change, after the bonding wires 380 are bonded to one terminal, an orientation of a subject to be bonded. As in the above-mentioned configuration, when normal directions of the first bonding surface and the second bonding surface are the same direction (in the first embodiment, positive direction of a Y axis as illustrated in FIG. 3), it is not required to change the orientation of the optical subassembly 100 as the subject to be bonded. The phrase "the normal directions are the same direction" indicates that an angle formed by the first bonding surface 335 and the second bonding surface 343 is so small that, after the bonding wires 380 are bonded on one surface, it is not required to change the orientation of the subject to be bonded before the bonding wires 380 are bonded to the other surface. In other words, both of the first bonding surface 335 and the second bonding surface 343 face the same direction (in the first embodiment, positive direction of the Y axis as illustrated in FIG. 3) so that the first bonding surface 335 and the second bonding surface 343 are surfaces that are substantially parallel to each other. Therefore, it becomes easier to manufacture the optical subassembly 100.

The temperature adjustment device 360 is arranged to be in contact with the first surface 311, and is configured to adjust the temperature of the optical device 350. Specifically, the temperature adjustment device 360 is a Peltier device, for example, and is arranged to be in contact with the first surface 311. The temperature adjustment device 360 is configured to cool the optical device 350 based on the control signals input from the third lead terminal 320C and the fourth lead terminal 320D. When temperature adjustment is not required, the temperature adjustment device 360 may be omitted.

In general, it is desired that the differential electrical signals supplied to the optical device 350 be coupled to conductor patterns connected to the ground. Further, a Peltier device is formed by sandwiching a semiconductor device from which to move heat with insulating substrates from both sides of the semiconductor device. Therefore, when the temperature adjustment device 360 is a Peltier device, the eyelet 310 and the device mounting unit 340 are insulated, and hence cannot supply a ground potential to the device mounting unit 340. However, according to the first embodiment, paths through which the differential electrical signals pass are formed, from the first lead terminal 320A and the second lead terminal 320B up to the optical device 350, as waveguides configured to propagate the differential electrical signals. Therefore, as described later, even when the device mounting unit 340 is not connected to the ground, high-frequency characteristics of the optical subassembly 100 can be improved.

The subcarrier 370 is to be mounted on the temperature adjustment device 360, and is to have the device mounting unit 340 mounted thereon. Specifically, for example, the subcarrier 370 is arranged, on the Z-axis direction side of the temperature adjustment device 360, via an interval from the seat 313 in the X-axis direction.

It is desired that the subcarrier 370 be made of an insulating material having a high heat conductivity, and a coefficient of thermal expansion close to that of the optical device 350. In the first embodiment, the subcarrier 370 is formed of ceramic, for example. Ceramic includes, irrespective of metal or non-metal, an inorganic solid material, such as a compact, powder, or film of an inorganic compound of an oxide, carbide, nitride, boride, or the like. For example, as ceramic used for the subcarrier 370, aluminum nitride having a heat conductivity of 170 to 200 [W/m·K] is desired. Further, on the surface facing the Y-axis direction of the subcarrier 370, the device mounting unit 340 is to be mounted.

The bonding wires 380 electrically connect the first conductor pattern 331 and the second conductor pattern 332 on the first bonding surface 335 to the third conductor pattern 341 and the fourth conductor pattern 342 on the second bonding surface 343, respectively. Specifically, three or more bonding wires 380 electrically connect the first conductor pattern 331 and the third conductor pattern 341. Similarly, three or more bonding wires 380 electrically connect the second conductor pattern 332 and the fourth conductor pattern 342. The bonding wires 380 connecting the first conductor pattern 331 and the third conductor pattern 341, and the bonding wires 380 connecting the second conductor pattern 332 and the fourth conductor pattern 342 are arranged in proximity to each other. As a result, three or more pairs of bonding wires 380 are formed as waveguides configured to propagate the differential electrical signals. Through the connection with the three or more pairs of bonding wires 380, an inductance that is parasitic on the bonding wires 380 can be reduced, and satisfactory transmission characteristics can be obtained.

Figure 8:
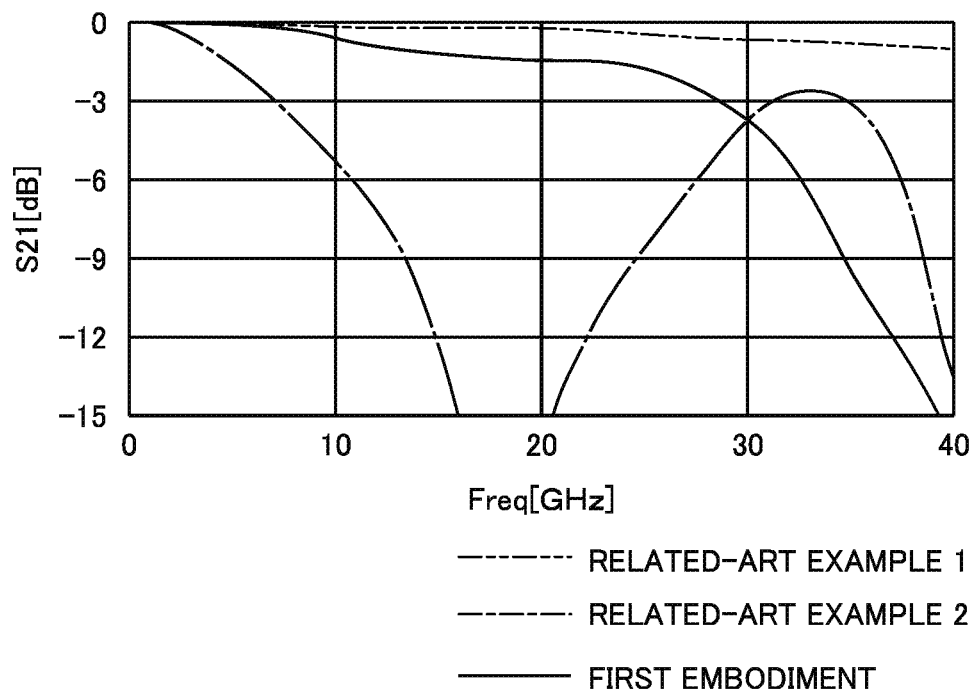
FIG. 8 is a graph obtained by calculating transmission characteristics (S21) of the optical module in the first embodiment, Related-Art Example 1, and Related-Art Example 2 with the use of a high frequency structure simulator (HFSS), which is a three-dimensional electromagnetic field simulator.

FIG. 8 is a graph obtained by calculating, for the configuration illustrated in FIG. 3, and configurations of Related-Art Example 1 and Related-Art Example 2, transmission characteristics (S21) of the optical module with the use of a high frequency structure simulator (HFSS), which is a three-dimensional electromagnetic field simulator.

Figure 9:
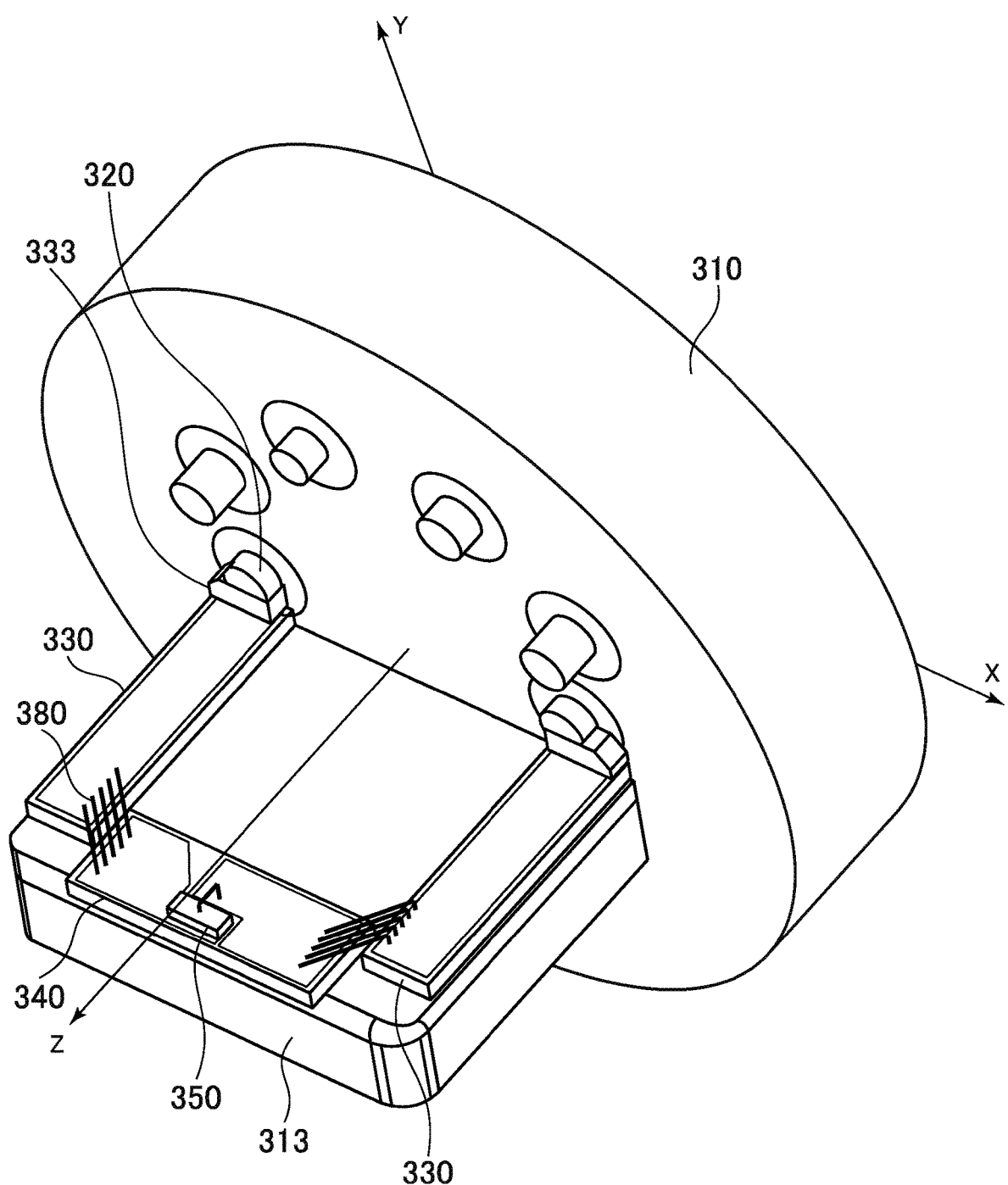
FIG. 9 is a schematic perspective view for illustrating an optical subassembly according to Related-Art Example 1.

An optical module in Related-Art Example 1 has mounted thereon an optical subassembly on which no temperature adjustment device 360 is mounted. Specifically, the optical subassembly in Related-Art Example 1 has the configuration illustrated in FIG. 9. The optical subassembly in Related-Art Example 1 includes a conductive stem made of metal having a diameter of 5.6 mm. The stem includes an eyelet 310 having through-holes 315 formed therein, and lead terminals 320 are fixed to the through-holes 315 with the dielectric material 314, such as glass. The eyelet 310, the dielectric material 314, and the lead terminals 320 form a coaxial line. An impedance of the coaxial line is matched to 25 Ohm. The lead terminals 320 penetrate through the holes formed in the eyelet 310, and partially protrude. Leading ends of the protruding lead terminals 320 are joined to conductor patterns on a surface of a relay substrate 330 mounted on a seat 313 projecting perpendicularly from the eyelet 310 with a AuSn solder. On the relay substrate 330, the seat 313 projecting from the stem having a ground potential and the conductor patterns form a microstrip line. Further, a device mounting unit 340 is die-bonded to the seat 313. The device mounting unit 340 is formed of ceramic, such as aluminum nitride, having a coefficient of thermal expansion close to that of an optical device 350. The device mounting unit 340 is a microstrip line including conductor patterns on front and rear surfaces thereof, and the conductor patterns on the rear surface are connected to the stem having the ground potential. On the device mounting unit 340, the optical device 350 is mounted.

Figure 10:
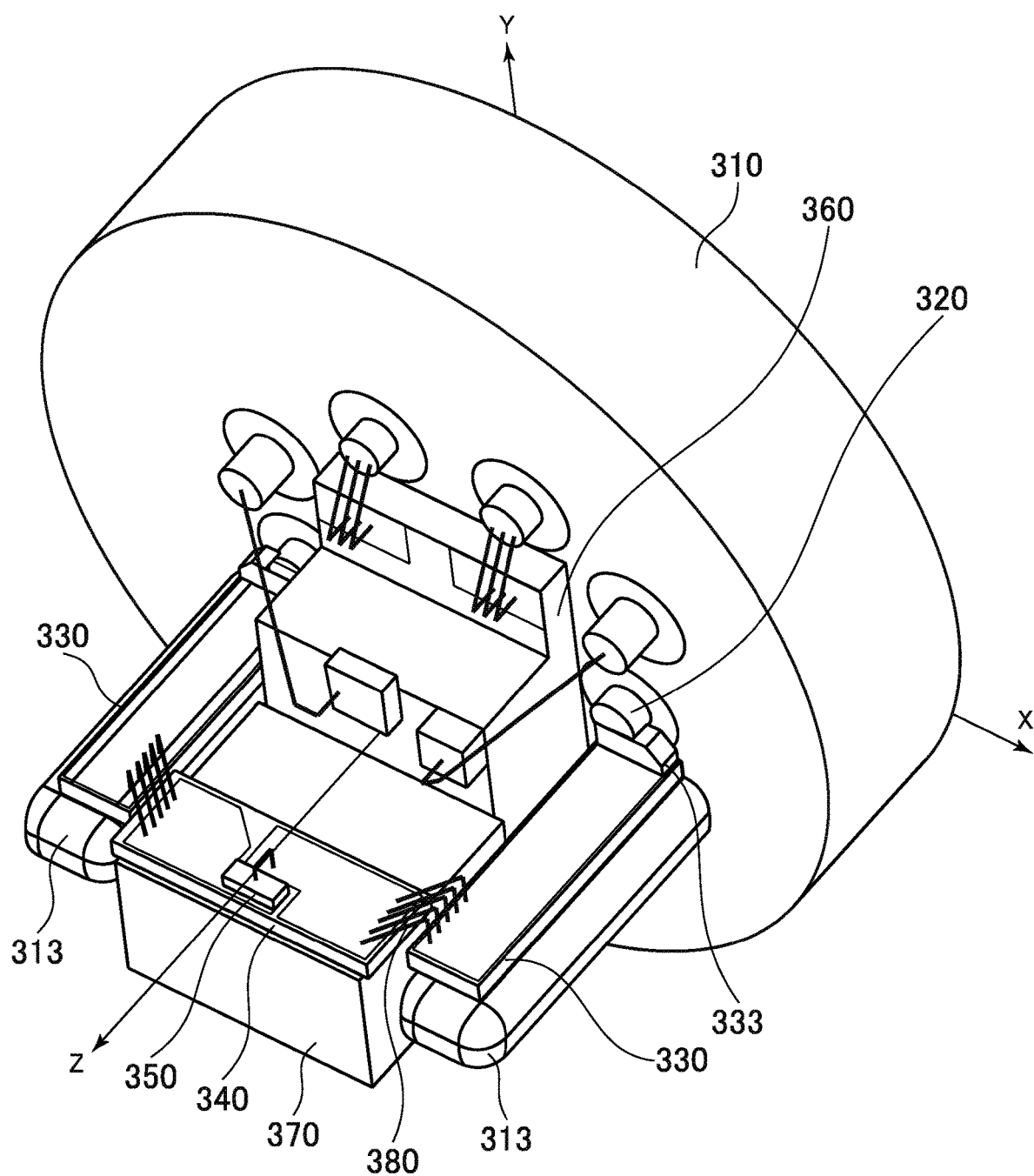
FIG. 10 is a schematic perspective view for illustrating an optical subassembly according to Related-Art Example 2.

An optical module in Related-Art Example 2 has mounted thereon an optical subassembly on which a temperature adjustment device 360 is mounted. Specifically, the optical subassembly in Related-Art Example 2 has the configuration illustrated in FIG. 10. The optical subassembly in Related-Art Example 2 includes the temperature adjustment device 360 and a subcarrier 370 in a center portion of an area in which the seat 313 in Related-Art Example 1 is provided. In order to increase a heat radiation property, the subcarrier 370 is formed of ceramic or metal having a high heat conductivity. Seats 313 are provided separately at two positions on both sides of the temperature adjustment device 360 and the subcarrier 370. Relay substrates 330 are arranged on the seats 313 separated into the two positions. A device mounting unit 340 having an optical device 350 mounted thereon is mounted on the subcarrier 370, and is configured to transmit and receive differential electrical signals to and from lead terminals 320 via the separated relay substrates 330. The two relay substrates 330 and the device mounting unit 340 form a microstrip line including conductor patterns formed on front and rear surfaces thereof. The temperature adjustment device 360 is a Peltier device, and hence the temperature adjustment device 360 includes insulating substrates in portions facing the eyelet 310 and the subcarrier 370. Therefore, to the rear surface of the surface of the device mounting unit 340 on which the optical device 350 is mounted, no ground potential is supplied.

As shown in FIG. 8, the optical subassembly in Related-Art Example 1 has high transmission characteristics even in a high frequency range with the ground potential being supplied to the rear surface of the device mounting unit 340. However, the optical subassembly in Related-Art Example 1 includes no temperature adjustment device 360, and hence cannot be used in a high-temperature environment.

Meanwhile, the optical subassembly in Related-Art Example 2 includes the temperature adjustment device 360, and hence can be used in a high-temperature environment. However, as shown in FIG. 8, the optical subassembly in Related-Art Example 2 has reduced transmission characteristics in the high frequency range with no ground potential being supplied to the rear surface of the device mounting unit 340.

In contrast, the optical subassembly 100 according to the first embodiment includes the temperature adjustment device 360, and hence can be used in a high-temperature environment. Further, as show in FIG. 8, the optical subassembly 100 according to the first embodiment has high transmission characteristics for high-frequency characteristics as compared to Related-Art Example 2. In the first embodiment, as opposed to Related-Art Example 2, the relay substrate 330 is not divided, and hence the waveguides configured to propagate the differential electrical signals are formed. The waveguides are formed to extend across two surfaces of a substrate that are perpendicular to each other. Therefore, in the first embodiment, as opposed to Related-Art Example 2, the differential electrical signals are propagated while electrical coupling between the differential electrical signals is maintained from the lead terminals 320 to immediately before the optical device 350. With this configuration, even under a state in which the ground potential is not supplied to immediately below the device mounting unit 340, the electromagnetic field is not converted into the higher-order mode by the electrical coupling between the differential electrical signals, and hence the differential electrical signals are propagated as the TEM mode. Therefore, the satisfactory transmission characteristics are obtained.

Figure 11:
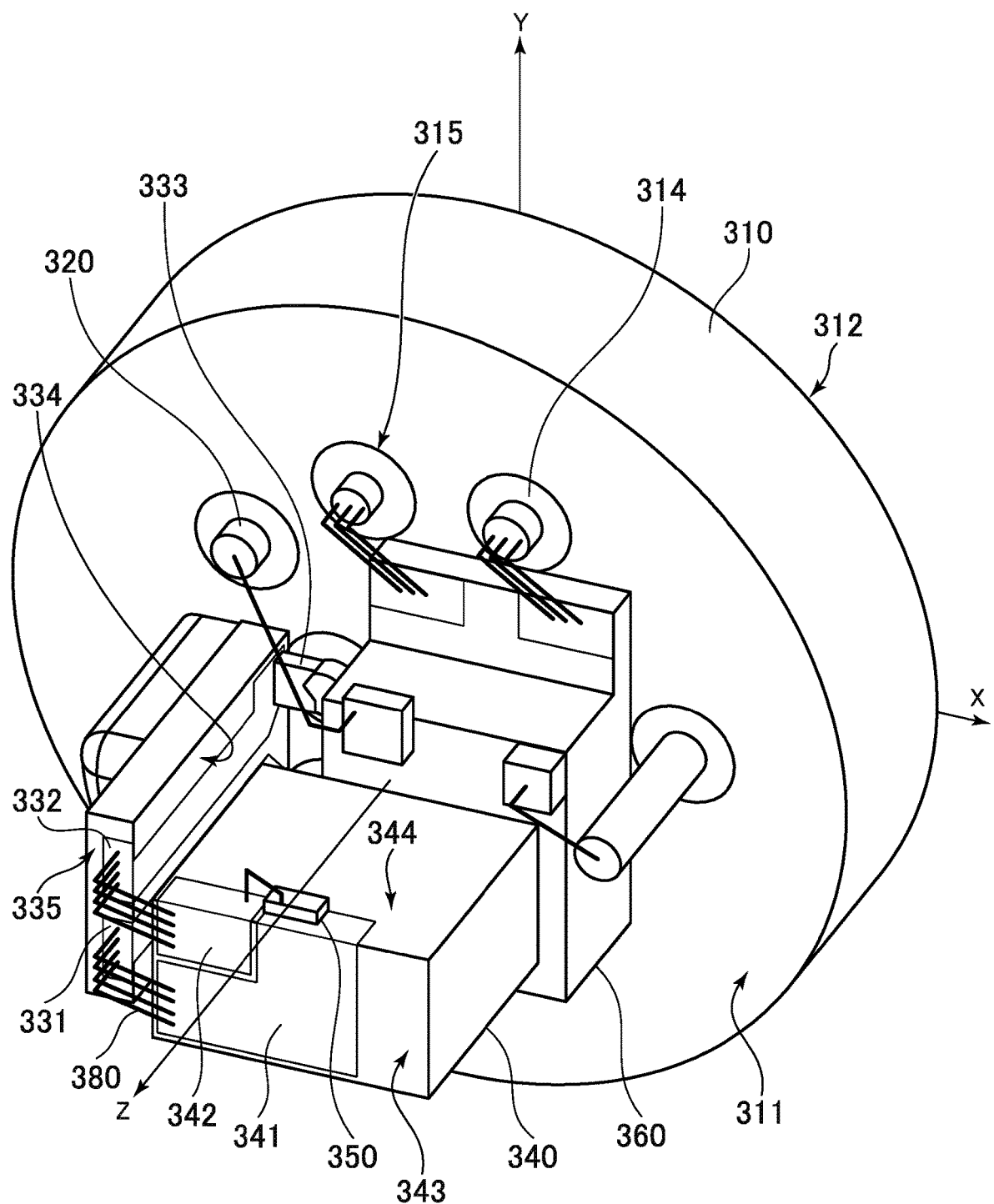
FIG. 11 is a schematic perspective view for illustrating an optical subassembly according to a second embodiment of the present invention.

FIG. 11 is a perspective view of an optical subassembly 100 included in an optical module 1 in a second embodiment of the present invention. In the optical subassembly 100 illustrated in FIG. 11, a third conductor pattern 341 and a fourth conductor pattern 342 are arranged to extend across a device mounting surface 344, on which an optical device 350 is mounted, and a second bonding surface 343. Specifically, the device mounting unit 340 is formed integrally with a subcarrier 370, for example. The third conductor pattern 341 and the fourth conductor pattern 342 are formed to extend across a surface facing the Y direction and a surface facing a Z direction of the device mounting unit 340. As in the first embodiment, the third conductor pattern 341 and the fourth conductor pattern 342 are formed, on the device mounting unit 340, as waveguides configured to propagate differential electrical signals.

The device mounting unit 340 further includes, as a surface adjacent to the second bonding surface 343, the device mounting surface 344 on which the optical device 350 is to be mounted. Specifically, the device mounting unit 340 includes, as the surface facing the Y direction, the device mounting surface 344 on which the optical device 350 is to be mounted, for example. The optical device 350 is mounted on the surface facing the Y direction of the device mounting unit 340, and is connected to the third conductor pattern 341 and the fourth conductor pattern 342 formed on the surface.

The relay substrate 330 includes a lead connection surface 334 extending in a normal direction of a first surface 311, and a first bonding surface 335 adjacent to the lead connection surface 334. In the second embodiment, the relay substrate 330 includes the lead connection surface 334 as a surface facing the X-axis direction, and the first bonding surface 335 as a surface facing a Z direction.

A first conductor pattern 331 and a second conductor pattern 332 on the first bonding surface 335 are connected to the third conductor pattern 341 and the fourth conductor pattern 342 on the second bonding surface 343 with the bonding wires 380, respectively. In the second embodiment, the first conductor pattern 331 formed on a surface facing the Z direction of the relay substrate 330 is electrically connected to the third conductor pattern 341 formed on the surface facing the Z direction of the device mounting unit 340. The second conductor pattern 332 formed on a surface facing the Z direction of the relay substrate 330 is electrically connected to the fourth conductor pattern 342 formed on the surface facing the Z direction of the device mounting unit 340.

Also in the above-mentioned configuration, both of the surfaces of the relay substrate 330 and the device mounting unit 340 to be connected by wire bonding are the surfaces facing the Z direction. Therefore, the bonding can be performed easily. Further, as in the first embodiment, with a direction the lead connection surface 334 having the larger area of the surfaces of the relay substrate 330 faces being arranged to be substantially perpendicular to the direction the surface of the third conductor pattern 341 and the fourth conductor pattern 342 faces, the eyelet 310 can have a large number of components arranged thereon, and can be manufactured easily.

Further, in the optical subassembly 100 according to the second embodiment illustrated in FIG. 11, a center of gravity of the subcarrier 370 may have a feature of being arranged to be displaced toward the relay substrate 330 with respect to a center of gravity of the eyelet 310. According to this mounting method, an area immediately above a glass coaxial unit can be used stably as a mounting area, which is advantageous in downsizing.

The optical subassembly 100 according to the second embodiment may also have a configuration including no temperature adjustment device 360, or a configuration in which three or more pairs of bonding wires 380 are provided.

Subsequently, a third embodiment of the present invention is described. Description of components similar to those of the first embodiment and the second embodiment is omitted. As described above, according to the first embodiment, the electromagnetic field is not converted into the higher-order mode by the electrical coupling between the differential electrical signals, and hence the differential electrical signals are propagated as the TEM mode. Therefore, satisfactory transmission characteristics are obtained. However, as shown in the simulation result of FIG. 8, when the ground potential is not supplied to the relay substrate 330, a range in which satisfactory response characteristics are exhibited is limited to 25 GHz. According to the third embodiment, an optical semiconductor laser having integrated therein an electroabsorption optical modulator that exhibits satisfactory response characteristics even in a high-frequency range of 30 GHz or more can be implemented.

Figure 12:
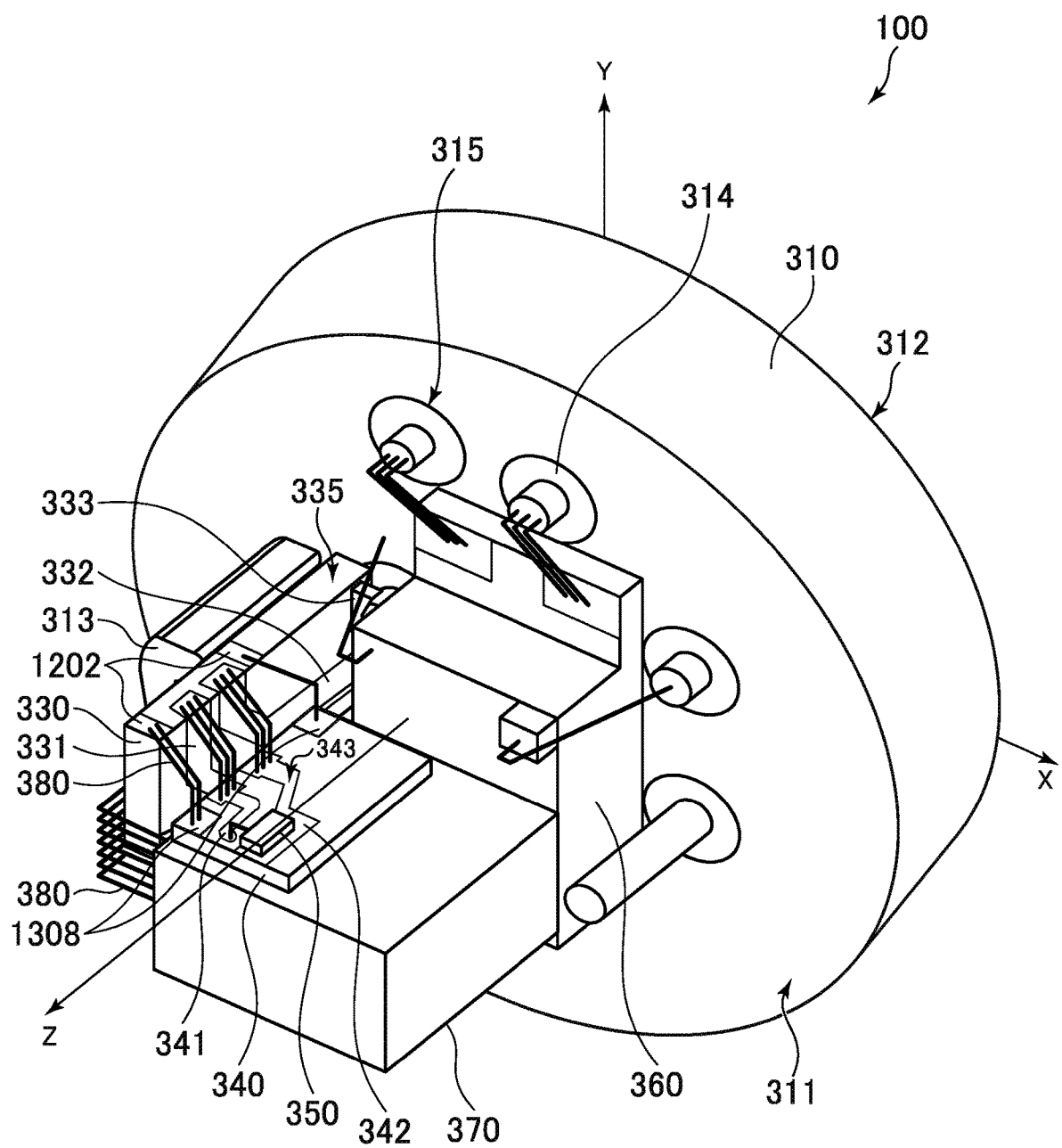
FIG. 12 is a schematic perspective view for illustrating an optical subassembly according to a third embodiment of the present invention.
Figure 13:
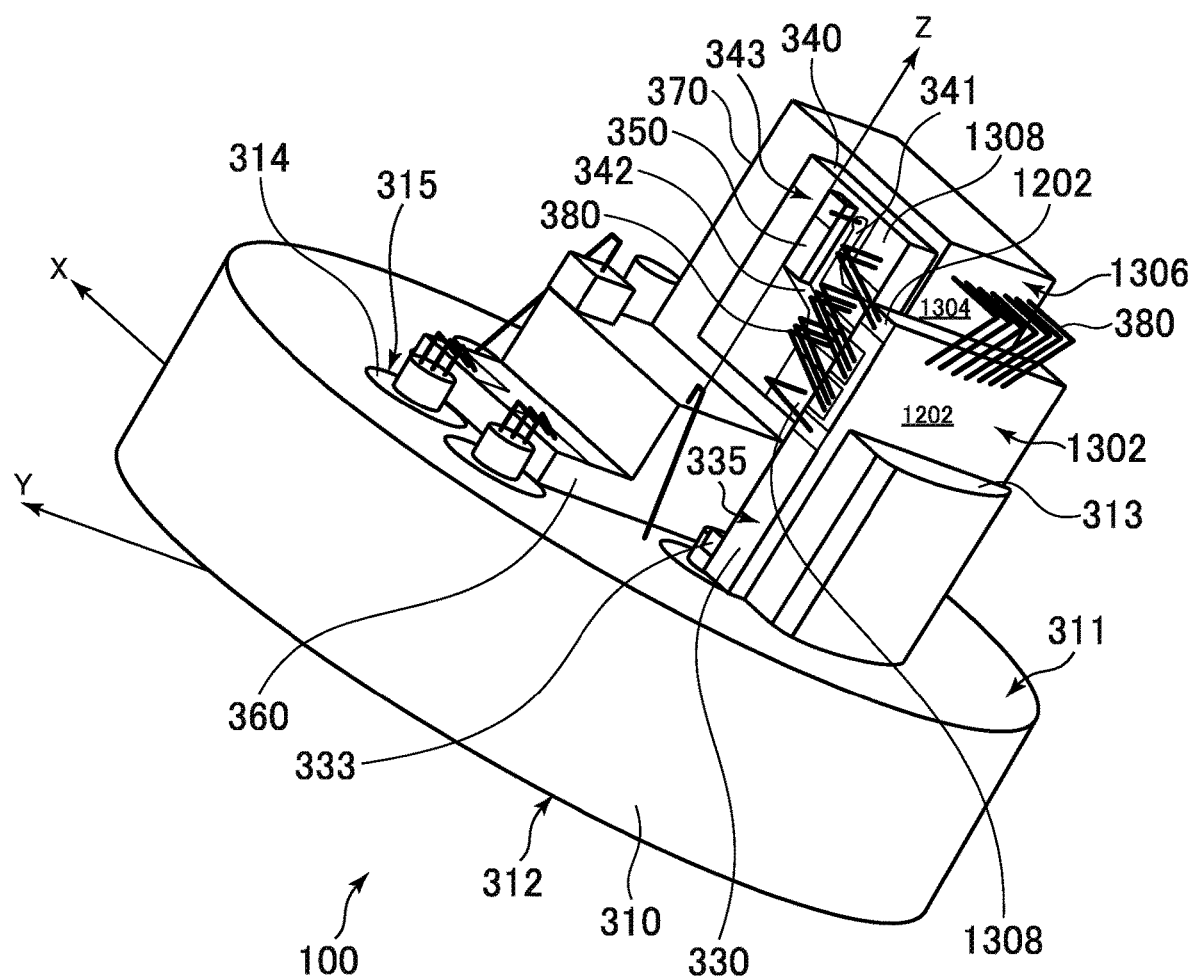
FIG. 13 is a schematic perspective view for illustrating the optical subassembly according to the third embodiment.
Figure 14:
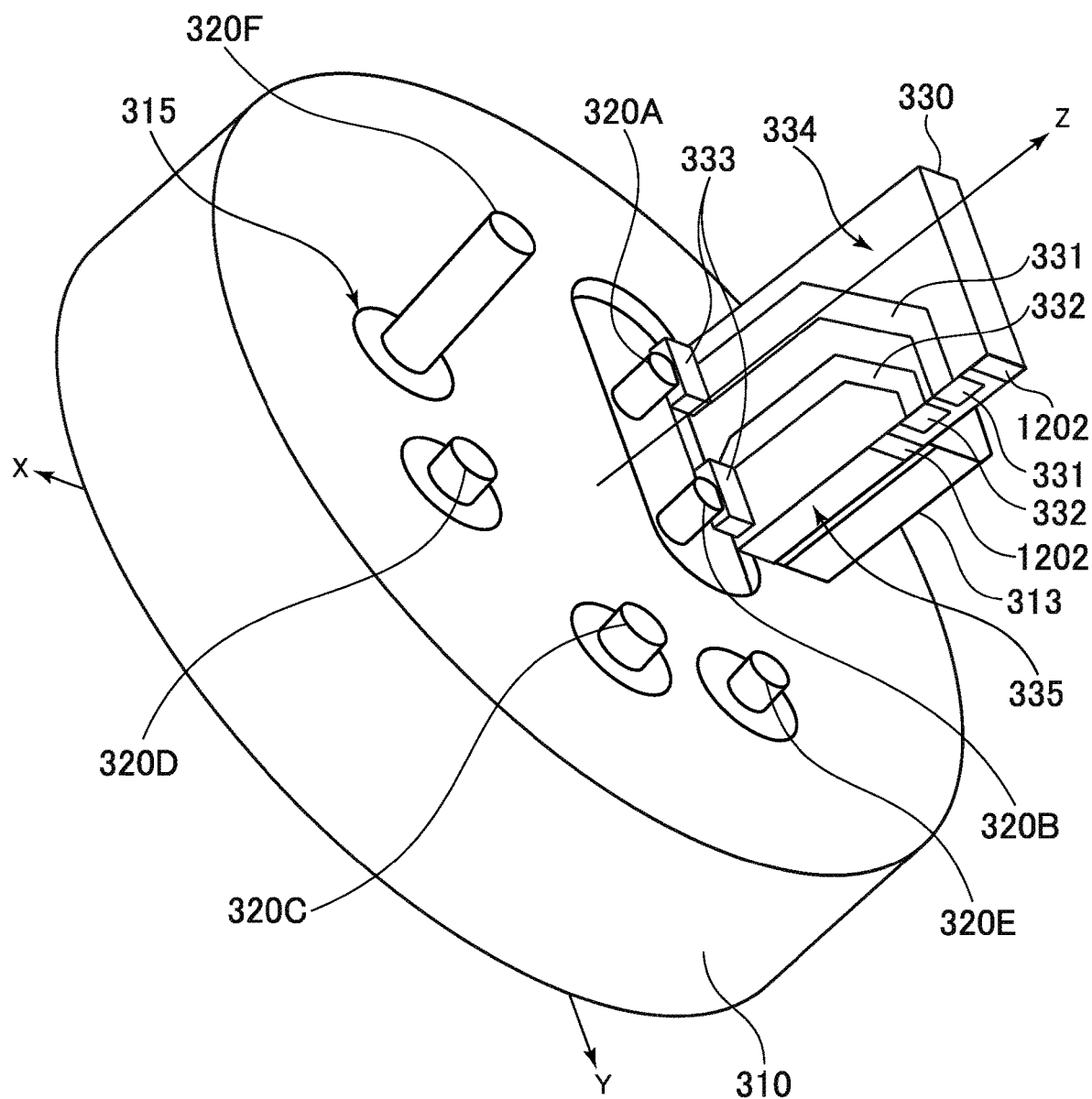
FIG. 14 is a schematic perspective view for illustrating a state in which a relay substrate is connected to a seat with a solder or conductive adhesive in the third embodiment.

FIG. 12 is a perspective view of an optical subassembly 100 included in an optical module 1 in the third embodiment. FIG. 13 is a perspective view of the optical subassembly 100 included in the optical module 1 in the third embodiment when viewed from another direction. FIG. 14 is a schematic perspective view for illustrating a state in which a relay substrate 330 in the third embodiment is connected to a seat 313 with a solder or conductive adhesive 333.

The relay substrate 330 further includes, as a surface adjacent to the first bonding surface 335, a first ground pattern surface 1302 having formed thereon a first ground pattern 1202 connected to the ground. Specifically, the relay substrate 330 has, on a surface on an opposite side from the lead connection surface 334 (that is, surface facing a −X-axis direction), the first ground pattern 1202 connected to the ground. In the example illustrated in FIG. 13, the first ground pattern 1202 is arranged over the entire surface on the opposite side from the lead connection surface 334.

The first ground pattern 1202 is arranged to extend across the first bonding surface 335. Specifically, the first ground pattern 1202 is arranged to extend from the surface on the opposite side from the lead connection surface 334 to the first bonding surface 335, for example. The first ground pattern 1202 arranged on the first bonding surface 335 is arranged on both sides of a first conductor pattern 331 and a second conductor pattern 332.

The first ground pattern 1202 may also be arranged on the −X-axis direction side of the first conductor pattern 331 and the second conductor pattern 332 on the first bonding surface 335. With this configuration, the first conductor pattern 331 and the second conductor pattern 332 are surrounded by the first ground pattern 1202 except for the portion thereof arranged to extend from the first bonding surface 335 to the lead connection surface 334.

A subcarrier 370 includes, as a surface parallel to the first ground pattern surface 1302, a second ground pattern surface 1306 having formed thereon a second ground pattern 1304 connected to the ground. Specifically, the subcarrier 370 includes, on a surface facing the −X-axis direction, the second ground pattern 1304 connected to the ground, for example. In the example illustrated in FIG. 13, the second ground pattern 1304 is arranged over the entire second ground pattern surface 1306.

The second ground pattern 1304 may be arranged to extend across a surface adjacent to the second ground pattern surface 1306. Specifically, for example, the second ground pattern 1304 may be arranged to extend from the second ground pattern surface 1306 to a surface facing the Y-axis direction of the subcarrier 370. In other words, the second ground pattern 1304 may be arranged over the entire surface of the subcarrier 370 that is in contact with the relay substrate 330. Further, the subcarrier 370 may be a metal block.

The first ground pattern 1202 is connected to the second ground pattern 1304 with bonding wires 380. Specifically, the first ground pattern 1202 formed on the first ground pattern surface 1302 of the relay substrate 330 is connected to the second ground pattern 1304 formed on the second ground pattern surface 1306 of the subcarrier 370 with the bonding wires 380, for example.

A device mounting unit 340 includes a third ground pattern 1308, which is connected to the ground and extends across at least two surfaces that are adjacent to each other. Specifically, for example, the device mounting unit 340 has formed, on the second bonding surface 343, the third ground pattern 1308 connected to the ground. The third ground pattern 1308 is arranged on both sides of the third conductor pattern 341 and the fourth conductor pattern 342. The third ground pattern 1308 is connected to the first ground pattern 1202 formed on the first bonding surface 335 with bonding wires 380. The device mounting unit 340 may be a metal block.

The third ground pattern 1308 may be arranged to extend, via a surface adjacent to the second bonding surface 343, to a surface on the rear side of the second bonding surface 343. The third ground pattern 1308 arranged on the surface on the rear side of the second bonding surface 343 is connected to the second ground pattern 1304 arranged on the surface facing the Y-axis direction of the subcarrier 370 to be connected to the ground.

The plurality of lead terminals include a pair of lead terminals, to which corresponding signals are input. Specifically, for example, the first lead terminal 320A and the second lead terminal 320B are the pair of lead terminals. A pair of differential electrical signals are input to the first lead terminal 320A and the second lead terminal 320B, respectively. The pair of lead terminals are fixed to a single through-hole 315 penetrating through the eyelet 310 with a dielectric material 314. For example, the pair of lead terminals (first lead terminal 320A and second lead terminal 320B) are fixed to the single through-hole 315 with glass, and the pair of lead terminals are designed to have a differential impedance matched to 100 Ohm.

Figure 15:
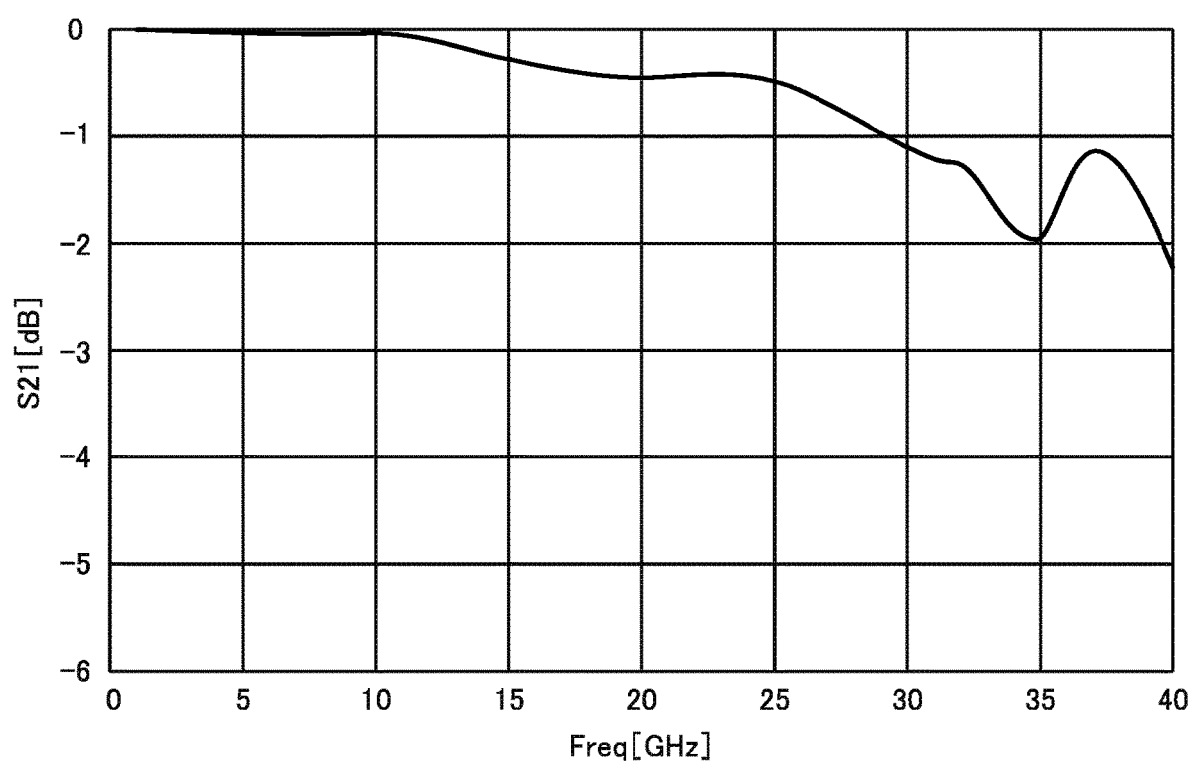
FIG. 15 is a graph obtained by calculating transmission characteristics (S21) of an optical module in the third embodiment with the use of a high frequency structure simulator (HFSS), which is a three-dimensional electromagnetic field simulator.

The third conductor pattern 341 and the fourth conductor pattern 342 illustrated in FIG. 12 and FIG. 13 are for a case in which the optical device 350 is an electroabsorption optical device. When an electroabsorption optical device is used, a drive IC having an output impedance of 100 Ohm is generally used to modulate differential signals. Therefore, the third conductor pattern 341 and the fourth conductor pattern 342, to which the differential signals are input, are designed to have an impedance matched to 100 Ohm, and hence each have a pattern width that is narrow as compared to the first embodiment and the second embodiment. According to the third embodiment, through the supply of the ground potential to the device mounting unit 340, high-frequency characteristics are stabilized, and satisfactory transmission characteristics are exhibited even in the high-frequency range of 30 GHz or more. FIG. 15 is a graph obtained by calculating transmission characteristics (S21) of the optical module 1 in the third embodiment with the use of a high frequency structure simulator (HFSS), which is a three-dimensional electromagnetic field simulator. With the ground potential being supplied to the third ground pattern 1308 of the device mounting unit 340, it can be seen that transmission characteristics at and over 30 GHz are also improved.

The first ground pattern surface 1302 and the second ground pattern surface 1306 may be formed not on the surface facing the −X-axis direction but on a surface facing the Z-axis direction. Specifically, for example, the relay substrate 330 may have, on the surface facing the Z-axis direction, the first ground pattern 1202 connected to the ground. The subcarrier 370 may have, on the surface facing the Z-axis direction, the second ground pattern 1304 connected to the ground. In this case, even when the relay substrate 330 is shorter in the Z-axis direction than the seat 313, the first ground pattern 1202 is exposed. Further, the first ground pattern 1202 and the second ground pattern 1304 are parallel to each other, and hence can be connected with the bonding wires 380.

The term "eyelet 310" indicating a metal disc is used herein. However, there is no essential significance to the eyelet 310 being of a disc shape, and the eyelet 310 may have a polygonal column shape or other shapes.

What is claimed is:

1. An optical subassembly, comprising:
   an eyelet including a first surface, a second surface arranged on an opposite side from the first surface, and a plurality of through-holes penetrating from the second surface through the first surface;
   a plurality of lead terminals, which are to be inserted into the plurality of through-holes, and to at least a part of which differential electrical signals are to be input;
   a relay substrate including a lead connection surface extending in a normal direction of the first surface, and a first bonding surface adjacent to the lead connection surface, and having a first conductor pattern and a second conductor pattern formed to extend across the lead connection surface and the first bonding surface, in which the first conductor pattern and the second conductor pattern formed on the lead connection surface are to be connected to at least a part of the plurality of lead terminals with a solder or conductive adhesive, and are configured to receive inputs of the differential electrical signals;
   a device mounting unit including a second bonding surface having formed thereon a third conductor pattern and a fourth conductor pattern, to which the differential electrical signals are to be input; and
   an optical device, which is to be mounted on the device mounting unit and electrically connected to the third conductor pattern and the fourth conductor pattern, and is configured to convert one of an optical signal and the differential electrical signals into the other,
   wherein the first conductor pattern and the second conductor pattern on the first bonding surface are to be connected to the third conductor pattern and the fourth conductor pattern on the second bonding surface with bonding wires, respectively, and
   wherein the first bonding surface and the second bonding surface have normal directions in the same direction.

2. The optical subassembly according to claim 1, further comprising a temperature adjustment device, which is arranged to be in contact with the first surface, and is configured to adjust a temperature of the optical device.

3. The optical subassembly according to claim 2, further comprising a subcarrier, which is to be mounted on the temperature adjustment device, and on which the device mounting unit is to be mounted.

4. The optical subassembly according to claim 3, wherein the subcarrier has a center of gravity arranged to be displaced toward the relay substrate with respect to a center of gravity of the eyelet.

5. The optical subassembly according to claim 3,
   wherein the relay substrate further includes, as a surface adjacent to the first bonding surface, a first ground pattern surface having formed thereon a first ground pattern connected to a ground,
   wherein the subcarrier includes, as a surface parallel to the first ground pattern surface, a second ground pattern surface having formed thereon a second ground pattern connected to the ground, and
   wherein the first ground pattern is connected to the second ground pattern by bonding wires.

6. The optical subassembly according to claim 5,
   wherein the first ground pattern is arranged to extend across the first bonding surface, and
   wherein the first ground pattern arranged on the first bonding surface is arranged on both sides of the first conductor pattern and the second conductor pattern.

7. The optical subassembly according to claim 5, wherein the device mounting unit is a metal block.

8. The optical subassembly according to claim 5, wherein the device mounting unit includes a third ground pattern, which is connected to the ground, and extends across at least two surfaces that are adjacent to each other.

9. The optical subassembly according to claim 1, wherein the bonding wires comprise three or more pairs of bonding wires.

10. The optical subassembly according to claim 1,
    wherein the device mounting unit further includes, as a surface adjacent to the second bonding surface, a device mounting surface, on which the optical device is to be mounted, and
    wherein the third conductor pattern and the fourth conductor pattern are arranged to extend across the device mounting surface and the second bonding surface.

11. The optical subassembly according to claim 1,
    wherein the plurality of lead terminals include a pair of lead terminals, to which corresponding signals are to be input, and
    wherein the pair of lead terminals are fixed to a single through-hole penetrating through the eyelet with a dielectric material.

* * * * *